United States Patent
Shei et al.

(10) Patent No.: US 7,335,519 B2
(45) Date of Patent: Feb. 26, 2008

(54) METHOD FOR MANUFACTURING A LIGHT-EMITTING DIODE

(75) Inventors: Shih-Chang Shei, Tainan County (TW); Ming-Lum Lee, Tainan County (TW)

(73) Assignee: Epitech Technology Corporation, Tainan County (TW)

( * ) Notice: Subject to any disclaimer, the term of this patent is extended or adjusted under 35 U.S.C. 154(b) by 383 days.

(21) Appl. No.: 11/105,832

(22) Filed: Apr. 14, 2005

(65) Prior Publication Data
US 2006/0199289 A1    Sep. 7, 2006

(51) Int. Cl.
*H01L 21/00* (2006.01)
(52) U.S. Cl. .......................................... 438/22; 438/39
(58) Field of Classification Search ............. 438/22–47
See application file for complete search history.

(56) References Cited

U.S. PATENT DOCUMENTS

| | | | | |
|---|---|---|---|---|
| 6,479,836 B1 * | 11/2002 | Suzuki et al. | ................ | 257/15 |
| 6,712,478 B2 * | 3/2004 | Sheu et al. | ................ | 257/79 |
| 6,914,268 B2 * | 7/2005 | Shei et al. | ................ | 257/99 |
| 7,078,256 B2 * | 7/2006 | Ryu et al. | ................ | 438/39 |
| 7,151,281 B2 * | 12/2006 | Shei et al. | ................ | 257/79 |
| 7,180,096 B2 * | 2/2007 | Wu et al. | ................ | 257/79 |
| 7,196,347 B2 * | 3/2007 | Ishikawa | ................ | 257/11 |
| 2003/0077847 A1 * | 4/2003 | Yoo | ................ | 438/22 |
| 2003/0087462 A1 * | 5/2003 | Koide et al. | ................ | 438/22 |
| 2004/0266044 A1 * | 12/2004 | Park et al. | ................ | 438/46 |
| 2005/0014305 A1 * | 1/2005 | Hsieh et al. | ................ | 438/39 |
| 2005/0221520 A1 * | 10/2005 | Ou et al. | ................ | 438/29 |
| 2006/0094138 A1 * | 5/2006 | Lai et al. | ................ | 438/22 |

\* cited by examiner

*Primary Examiner*—Savitri Mulpuri
(74) *Attorney, Agent, or Firm*—Thomas, Kayden, Horstemeyer & Risley

(57) ABSTRACT

A method for manufacturing a light-emitting diode (LED) is disclosed. In the method, a substrate is firstly provided, in which a first conductivity type cladding layer, an active layer, a second conductivity type cladding layer, a superlattice contact layer and a transparent conductive oxide layer are stacked on the substrate in sequence. Next, an etching mask layer is formed on a portion of the transparent conductive oxide layer, in which the etching mask layer is an insulator. Then, a definition step is performed by using the etching mask layer to remove an exposed portion of the transparent conductive oxide layer, and the superlattice contact layer, the second conductivity type cladding layer and the active layer under the exposed portion of the transparent conductive oxide layer until the first conductivity type cladding layer is exposed. The etching mask layer is then removed. Subsequently, a first conductivity type electrode is formed on the exposed portion of the first conductivity type cladding layer, and a second conductivity type electrode is formed on the transparent conductive oxide layer.

22 Claims, 12 Drawing Sheets

METHOD FOR MANUFACTURING A LIGHT-EMITTING DIODE

RELATED APPLICATIONS

The present application is based on, and claims priority from, Taiwan Application Serial Number 94106119, filed Mar. 1, 2005, the disclosure of which is hereby incorporated by reference herein in its entirety.

FIELD OF THE INVENTION

The present invention relates to a method for manufacturing a light-emitting diode (LED), and more particularly, to a method for manufacturing a light-emitting diode, in which the process can be simplified.

BACKGROUND OF THE INVENTION

FIGS. 1a to 1n are schematic flow diagrams showing the process for manufacturing a conventional light-emitting diode. Conventionally, in the fabrication of the light-emitting diode, a substrate 100 is firstly provided, in which the substrate 100 is a sapphire substrate, for example. Next, an N-type cladding layer 102, an active layer 104 for illuminating and a P-type cladding layer 106 are grown on the substrate 100 in sequence by an epitaxial method, in which a material of the N-type cladding layer 102 is N-type doped GaN, and a material of the P-type cladding layer 106 is P-type doped GaN. Then, a contact layer 108 is formed on the P-type cladding layer 106, such as shown in FIG. 1a. A material of the contact layer 108 is P-type doped GaN.

A nickel metal layer 110, which is used as an etching mask layer, is deposited to cover the contact layer 108. A photoresist layer 112 is coated on the nickel metal layer 110 to form a structure such as shown in FIG. 1b. After the photoresist layer 112 is formed, a pattern is defined into the photoresist layer 112 by a photolithography process and a first mask (not shown), in which a portion of the photoresist layer 112 is removed to expose a portion of the nickel metal layer 110, such as shown in FIG. 1c. The exposed portion of the nickel metal layer 110 is etched and removed by using the patterned photoresist layer 112 as an etching mask until the underlying contact layer 108 is exposed, so that the pattern in the photoresist layer 112 is transformed into the nickel metal layer 110, such as shown in FIG. 1d. After the pattern is transformed into the nickel metal layer 110, the remaining photoresist layer 112 can be stripped, so that a structure such as shown in FIG. 1e is formed.

Next, the exposed portion of the contact layer 108 as well as the underlying portions of the P-type cladding layer 106 and the active layer 104 are etched and removed by using the patterned nickel metal layer 110 as an etching mask until the N-type cladding layer 102 is exposed, such as shown in FIG. 1f. The remaining nickel metal layer 110 is removed to expose the contact layer 108, such as shown in FIG. 1g. After the nickel metal layer 110 is removed, a transparent contact layer 114 is deposited on the contact layer by using a second mask (not shown), in which the transparent contact layer 114 is composed of a Ni/Au structure. For better process reliability, the edge of the transparent contact layer 114 and the edge of the contact layer 108 are separated by a distance, i.e., the transparent contact layer 114 is just located on a portion of the top surface of the contact layer 108 rather than the entire top surface of the contact layer 108, such as shown in FIG. 1h. After the transparent contact layer 114 is formed, a thermal alloying treatment is performed on the transparent contact layer 114 to form ohmic contact between the transparent contact layer 114 and the contact layer 108, such as shown in FIG. 1i.

After the thermal alloying treatment of the transparent contact layer 114 is completed, a cathode contact layer 116 is deposited on a portion of the exposed portion of the N-type cladding layer 102 by using a third mask (not shown), so as to form a structure such as shown in FIG. 1j. The cathode contact layer 116 is composed of a Ti/Al structure. Then, a thermal alloying treatment is performed on the cathode contact layer 116 to form ohmic contact between the cathode contact layer 116 and the N-type cladding layer 102, such as shown in FIG. 1k. Next, a cathode electrode 118 and an anode electrode 120 are respectively deposited on the cathode contact layer 116 and a portion of the transparent contact layer 114 by using a fourth mask, such as shown in FIG. 1l. Each of the cathode electrode 118 and the anode electrode 120 is composed of a Ti/Au structure.

After the cathode electrode 118 and the anode electrode 120 are formed, a dielectric film, which is used as a protective layer 122, is deposited to cover the cathode electrode 118, the anode electrode 120, the exposed portion of the contact layer 108, the transparent contact layer 114, the N-type cladding layer 102, the cathode contact layer 116, the P-type cladding layer 106 and the active layer 104, such as shown in FIG. 1m. Subsequently, a definition step is performed on the protective layer 122 by using a fifth mask (not shown), to remove portions of the protective layer 122 located on the cathode electrode 118 and the anode electrode 120 and expose the cathode electrode 118 and the anode electrode 120, so that the fabrication of the light-emitting diode device such as shown in FIG. 1n is completed.

In the processing of the conventional light-emitting diode, because the nickel metal layer 110 is used as the etching mask, the contamination of metal material may occur to result in a short circuit in the device. In additional, due to the limitation of the process, the size of the transparent contact layer 114 is less than that of the contact layer 108, so the illuminating area of the device is decreased to reduce the brightness of the device. Furthermore, the transparency of the transparent contact layer 114 is lower, and a thermal alloying is additionally needed for a better ohmic contact while using the Ni/Au structure as the transparent contact layer 114, so that the brightness of the device is lowered and the amount of the process steps is increased to raise the cost. Moreover, in the entire process, five masks are needed, so that the cost is greatly increased, many extra process steps are added, the process time is prolonged to result in lowered productivity, and the product yield is adversely affected.

SUMMARY OF THE INVENTION

In accordance with the disadvantages caused by the conventional process for manufacturing a light-emitting diode, one objective of the present invention is to provide a method for manufacturing a light-emitting diode, in which an insulating etching mask layer is formed on a transparent conductive oxide layer, so that the contamination resulting from the use of metal mask materials can be avoided, to prevent the short circuit condition caused by the metal mask materials from occurring.

Another objective of the present invention is to provide a method for manufacturing a light-emitting diode, in which a transparent conductive oxide layer and epitaxial layers are etched by a self-aligned method, so that there is no mask employed in the etching processes of the transparent conductive oxide layer and the epitaxial layers. Accordingly, the amount of the masks is decreased, and the illuminative area of the device is increased to enhance the brightness of the device.

Still another objective of the present invention is to provide a method for manufacturing a light-emitting diode, in which only two masks are employed in the manufacturing process, so that the process cost is lowered, the amount of the process steps is decreased, the process time is shortened, and the throughput and the yield are effectively enhanced.

According to the aforementioned objectives, the present invention provides a method for manufacturing a light-emitting diode comprising the following steps. A substrate is firstly provided, in which an illuminant epitaxial structure, a superlattice contact layer and a transparent conductive oxide layer are stacked on the substrate in sequence, and the illuminant epitaxial structure comprises a first conductivity type cladding layer, an active layer and a second conductivity type cladding layer stacked in sequence. Next, an etching mask layer is formed on a portion of the transparent conductive oxide layer. Then, a definition step is performed by using the etching mask layer to remove an exposed portion of the transparent conductive oxide layer, and the superlattice contact layer, the second conductivity type cladding layer and the active layer underlying the exposed portion of the transparent conductive oxide layer until the first conductivity type cladding layer is exposed. The etching mask layer is then removed. Subsequently, a first conductivity type electrode is formed on the exposed portion of the first conductivity type cladding layer, and a second conductivity type electrode is formed on the transparent conductive oxide layer.

According to a preferred embodiment of the present invention, a material of the transparent conductive oxide layer can be indium tin oxide (ITO), indium zinc oxide (IZO) or aluminum-doped zinc oxide (ZnO:Al, AZO). A material of the etching mask layer is an insulating material, such as silicon dioxide, silicon nitride or silicon oxy-nitride. The first conductivity type electrode and the second conductivity type electrode can be composed of Cr/Au structures or a Cr/Pt/Au structure.

By deposing a dielectric mask layer on a transparent conductive oxide layer, the fabrication of a light-emitting diode structure is completed while only two masks are employed, and the transparent conductive oxide layer and epitaxial layers can be etched by a self-aligned method. Accordingly, the manufacture cost is lowered and the illuminative area is increased to achieve the purposes of enhancing the brightness, the yield and the throughput.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention discloses a method for manufacturing a light-emitting diode, in which only two masks are employed, such that the process time can be effectively shortened to increase the throughput, the cost can be decreased, and the yield can be greatly enhanced. In order to make the illustration of the present invention more explicit and complete, the following description is stated with reference to FIGS. 2a to 2i.

Figure 1A:
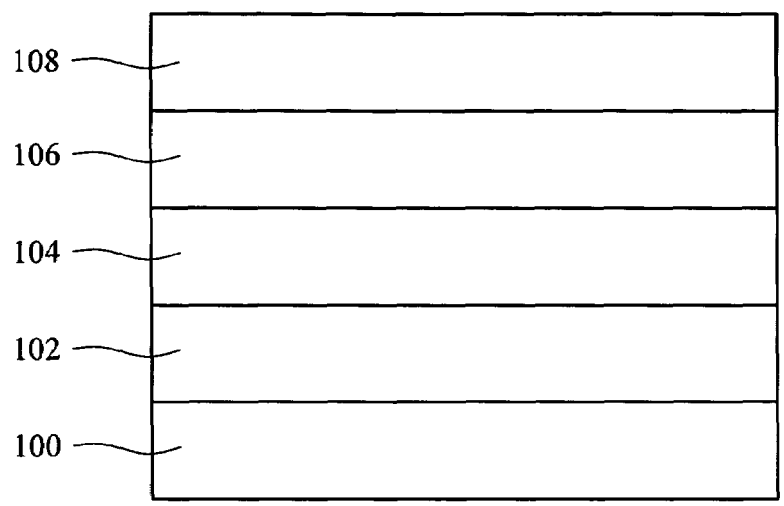
FIGS. 1a to 1n are schematic flow diagrams showing the process for manufacturing a conventional light-emitting diode.
Figure 1B:
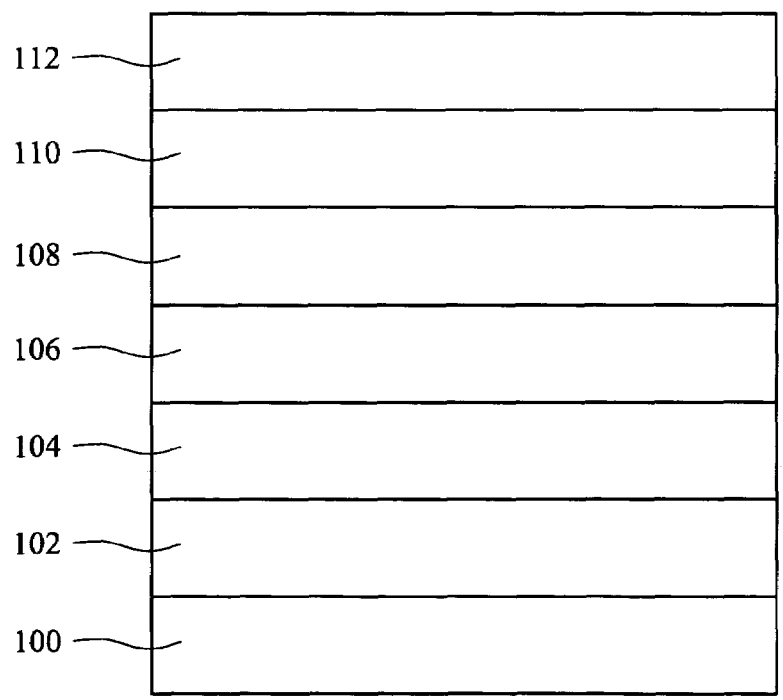
Figure 1C:
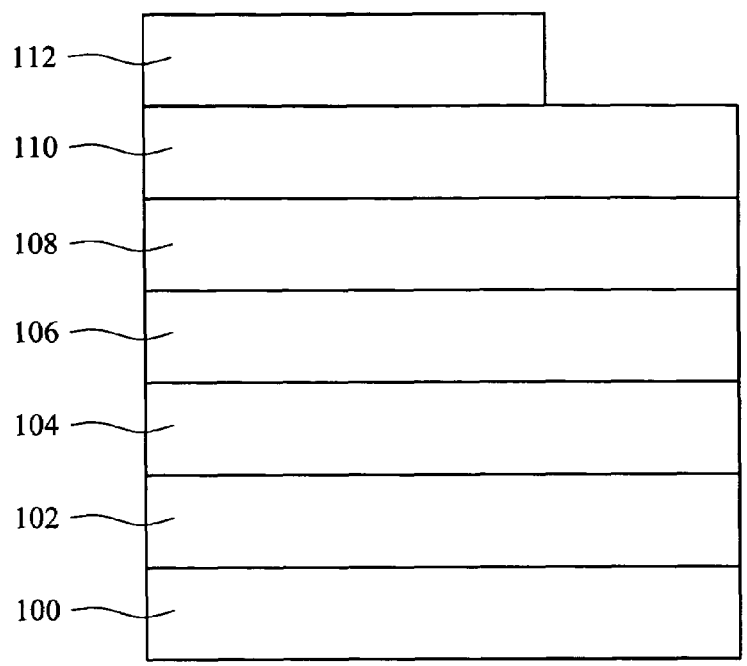
Figure 1D:
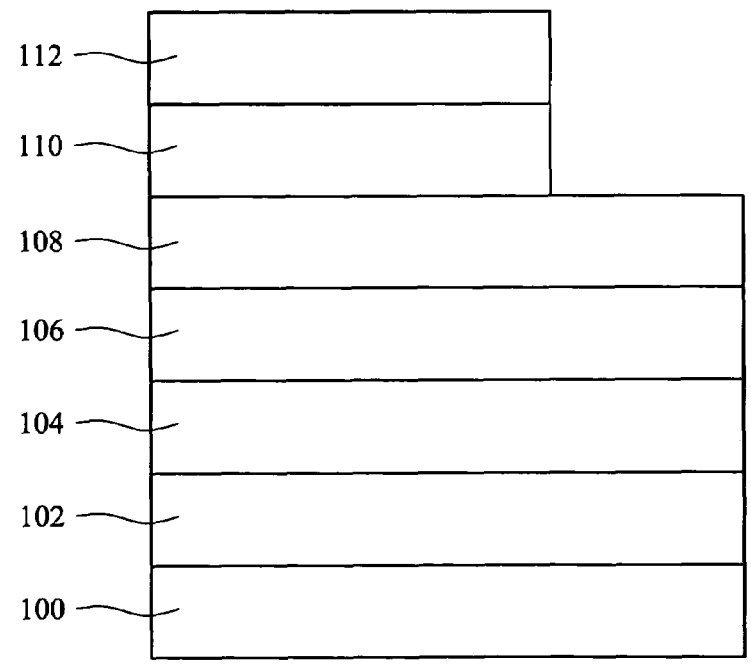
Figure 1E:
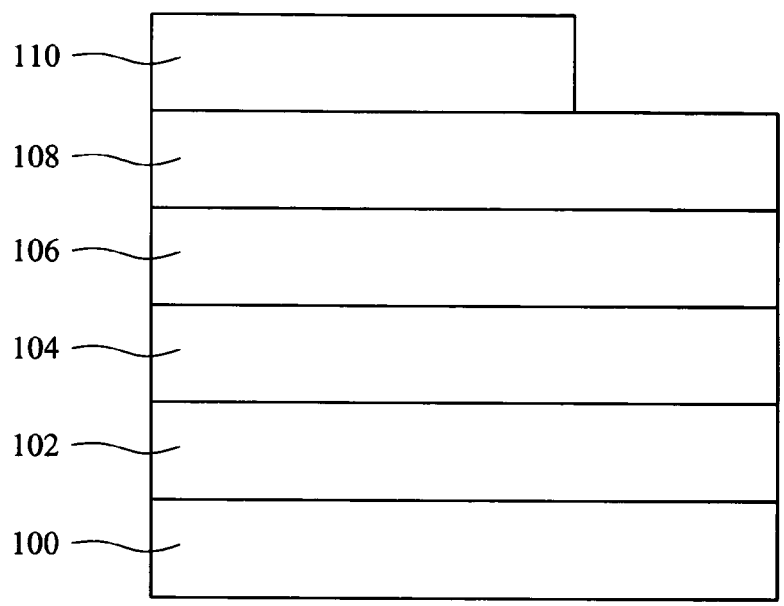
Figure 1F:
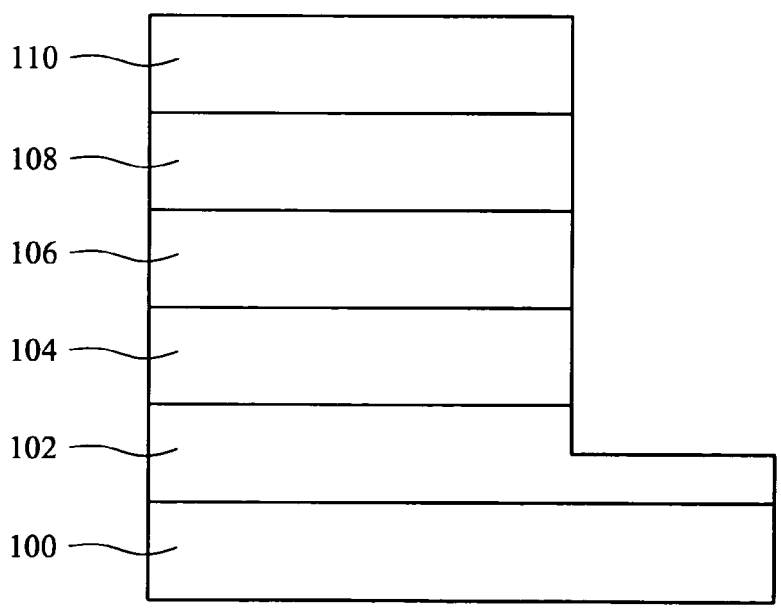
Figure 1G:
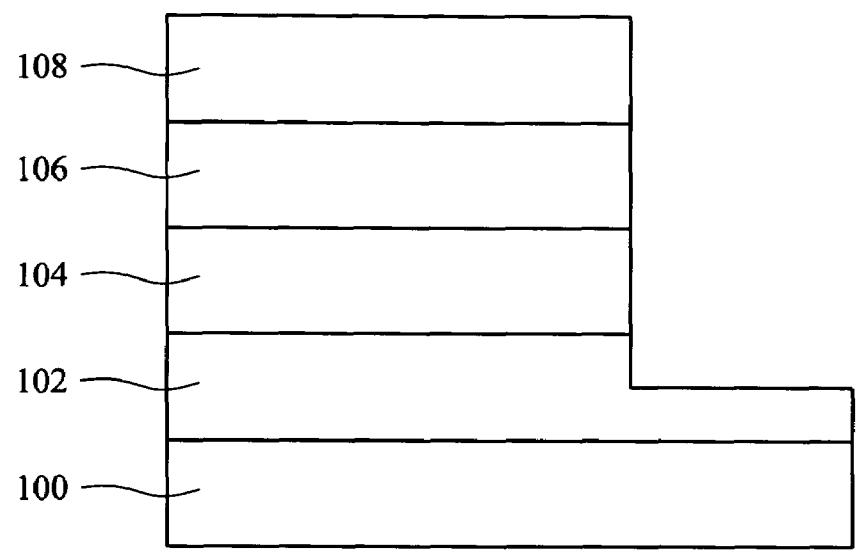
Figure 1H:
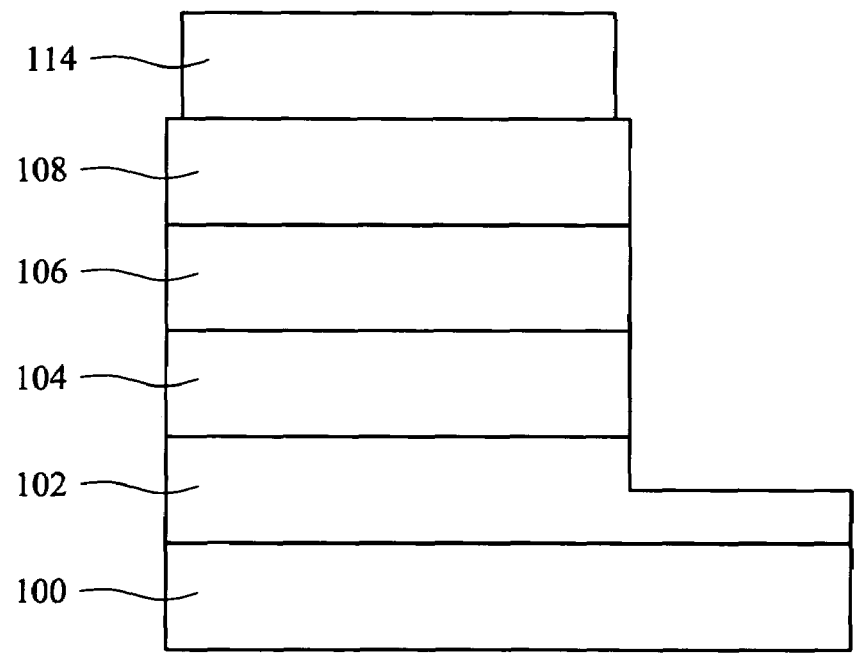
Figure 1I:
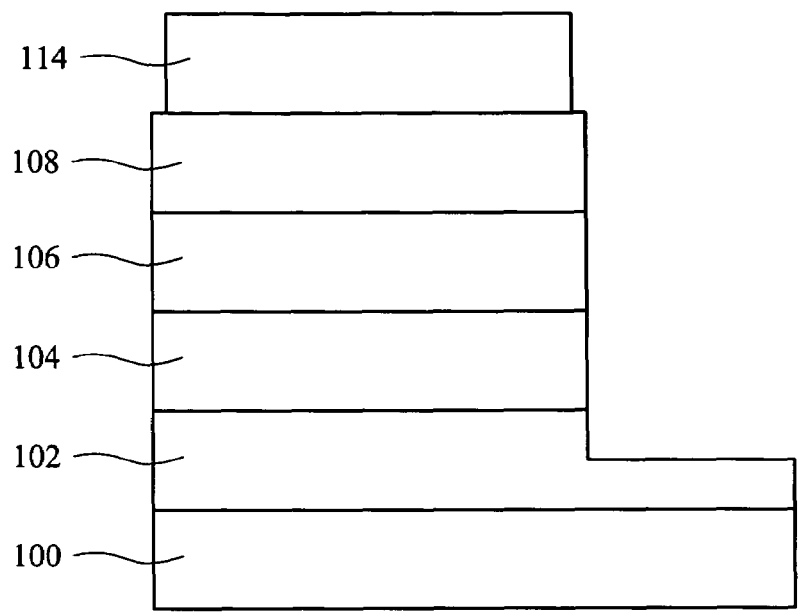
Figure 1J:
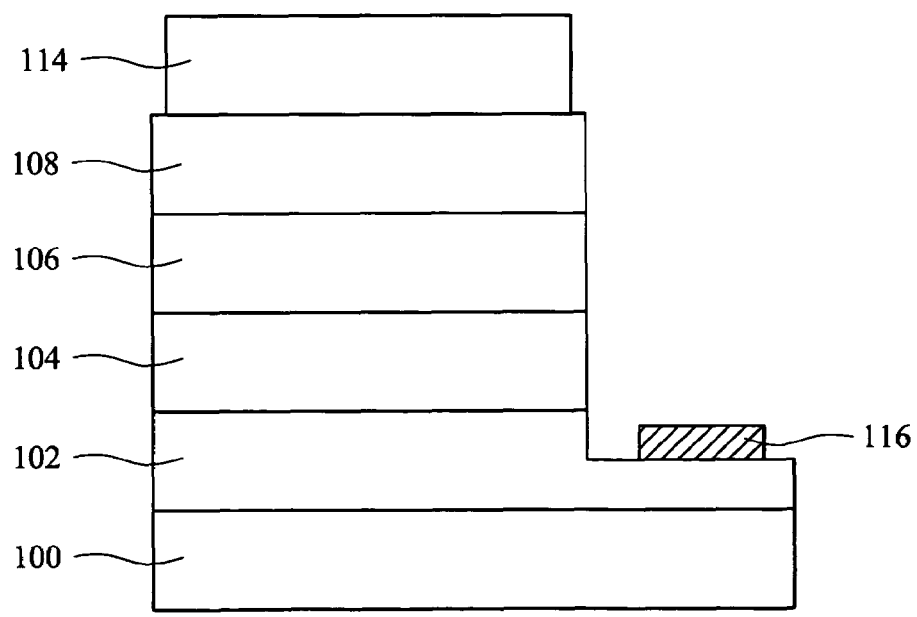
Figure 1K:
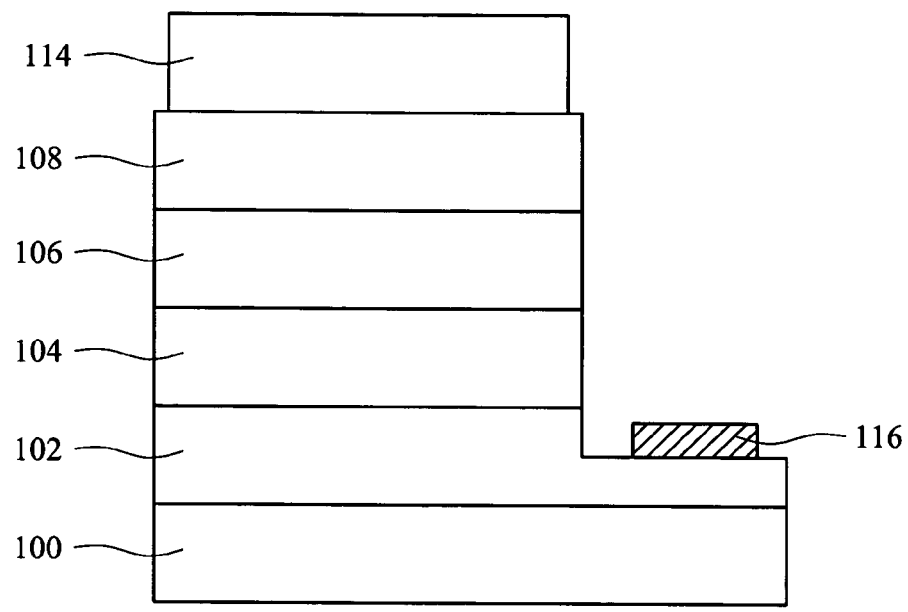
Figure 1L:
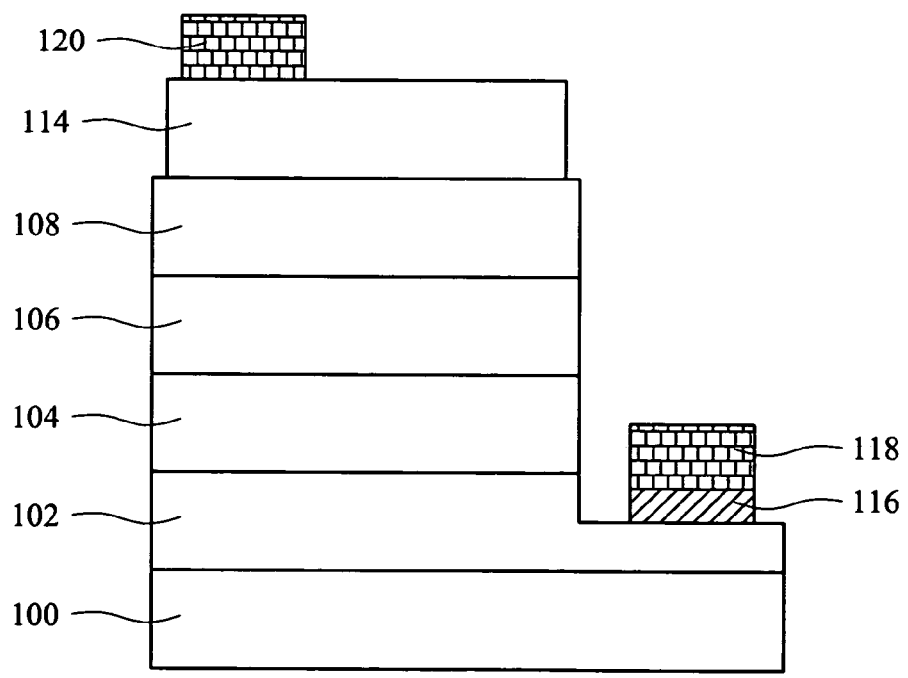
Figure 1M:
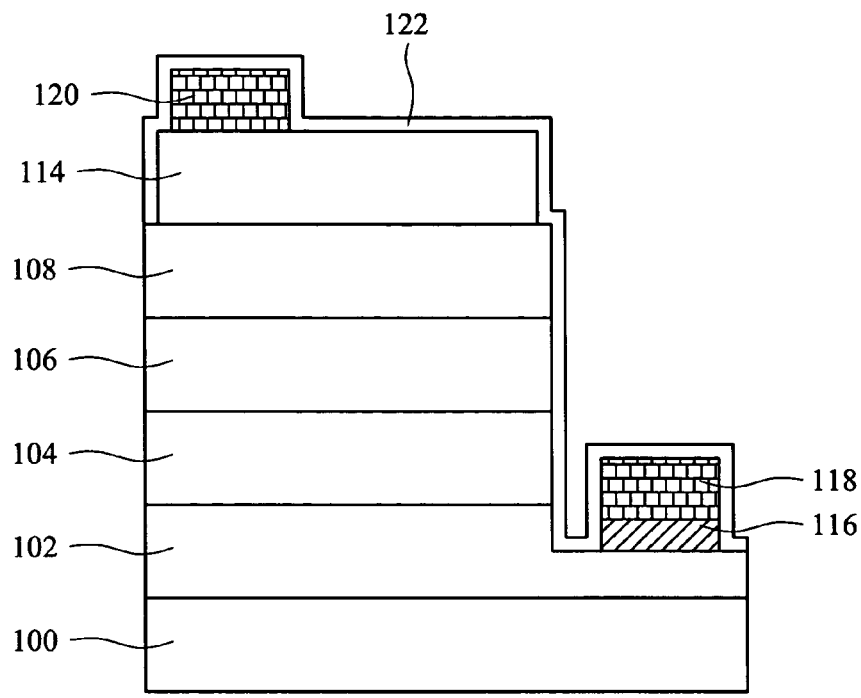
Figure 1N:
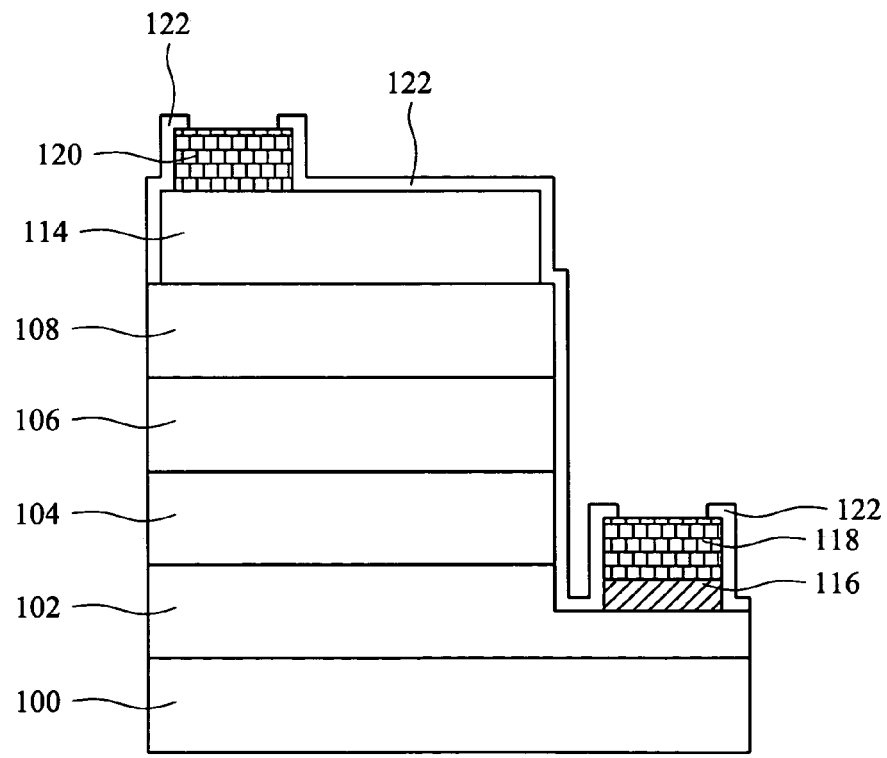
Figure 2A:
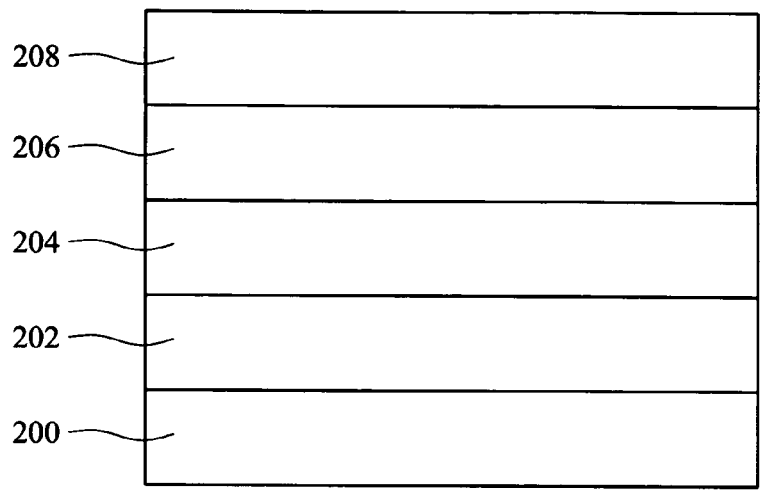
FIGS. 2a to 2i are schematic flow diagrams showing the process for manufacturing a light-emitting diode in accordance with a preferred embodiment of the present invention.

FIGS. 2a to 2i are schematic flow diagrams showing the process for manufacturing a light-emitting diode in accordance with a preferred embodiment of the present invention. When the method of the present invention is used to manufacture a light-emitting diode, a substrate 200 is firstly provided, in which the substrate 200 is preferably composed of, for example, sapphire, SiC, ZnO, Si, GaP, GaAs, $Al_2O_3$ or other suitable substrate materials. A first conductivity type cladding layer 202, an active layer 204 and a second conductivity type cladding layer 206 are epitaxially grown on the substrate 200 in sequence by, for example, a metal organic chemical vapor deposition (MOCVD) method. The first conductivity type is opposite to the second conductivity type: the first conductivity type is N-type while the second conductivity type is P-type, and the first conductivity type is P-type while the second conductivity type is N-type. A material of the first conductivity type cladding layer 202 can be a III-V compound containing GaN, such as an N-type doped $Al_xIn_yGa_{1-x-y}N$ (where x and y≧0; and 0≦x+y<1). The active layer 204 can be composed of a III-V nitride compound containing GaN. In the preferred embodiment, the active layer 204 can be a quantum well structure composed of undoped or doped $Al_aIn_bGa_{1-a-b}N/Al_xIn_yGa_{1-x-y}N$ (where a and b≧0; 0≦a+b<1; x and y≧0; 0≦x+y<1; and x>a), in which the dopants can be N-type or P-type. A material of the second conductivity type cladding layer 206 can be a III-V compound containing GaN, such as a P-type doped $Al_xIn_yGa_{1-x-y}N$ (where x and y≧0; and 0≦x+y <1). Next, a superlattice contact layer 208 is epitaxially grown on the second conductivity type cladding layer 206, such as shown in FIG. 2a. The superlattice contact layer 208 is preferably composed of a III-V compound material with a high carrier concentration, and more preferably a strained layer superlattice (SLS). In a preferred embodiment of the present invention, a material of the superlattice contact layer 208 can be a III-V compound containing GaN, such as a $Al_uIn_vGa_{1-u-v}N$ (where u and v≧0; 0≦u+v≦1; x and y≧0; 0≦x+y<1; and x>u) strained layer superlattice. The dopants of the superlattice contact layer 208 can be n-type or P-type.

Figure 2B:
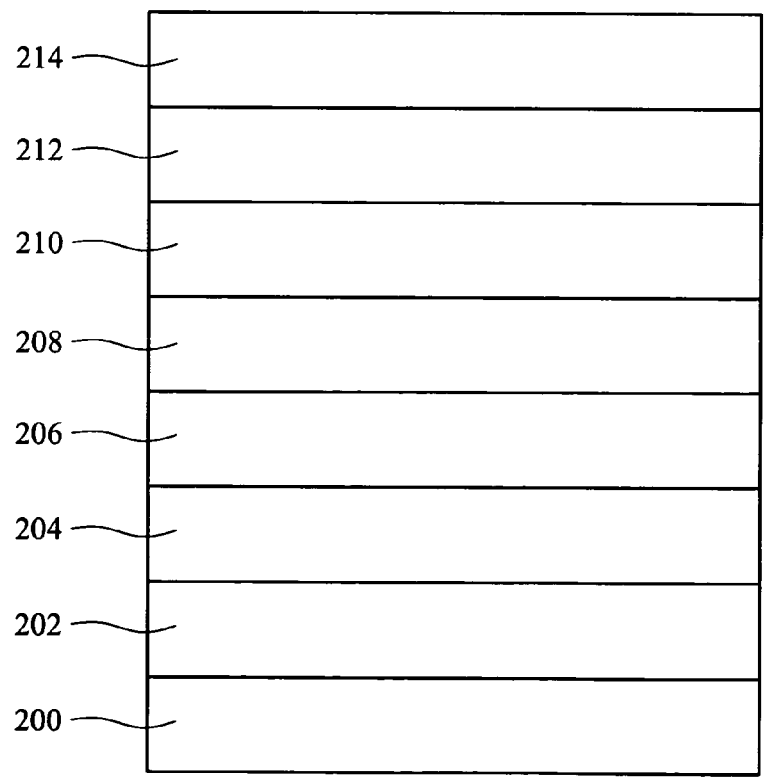

Then, a transparent conductive oxide layer 210 is formed on the superlattice contact layer 208, in which a material of the transparent conductive oxide layer 210 is, for example, ITO, IZO or AZO. An etching mask layer 212 is formed on the transparent conductive oxide layer 210 by, for example, a chemical vapor deposition method. In the present invention, the etching mask layer 212 is composed of an insulating dielectric material, such as $SiO_2$, $Si_3N_4$ or SiON, and the material of the etching mask layer 212 has stronger adhesion to the transparent conductive oxide layer 210. After the deposition of the etching mask layer 212, a photoresist layer 214 is formed to cover the etching mask layer 212 by a spin coating method, such as shown in FIG. 2b.

A feature of the present invention is to use a dielectric material to form the etching mask layer 212, so that the contamination resulting from using a nickel metal layer as the etching mask can be avoided to prevent the short circuit condition caused by the metal contamination from occurring. Moreover, because the etching mask layer 212 has superior adhesion to the transparent conductive oxide layer 210, it is hard for the etching mask layer 212 to separate from the transparent conductive oxide layer 210. Furthermore, the transparent conductive oxide layer 210 is composed of a transparent oxide material, which has good transparency, so that the brightness of the light-emitting diode device can be increased.

Figure 2C:
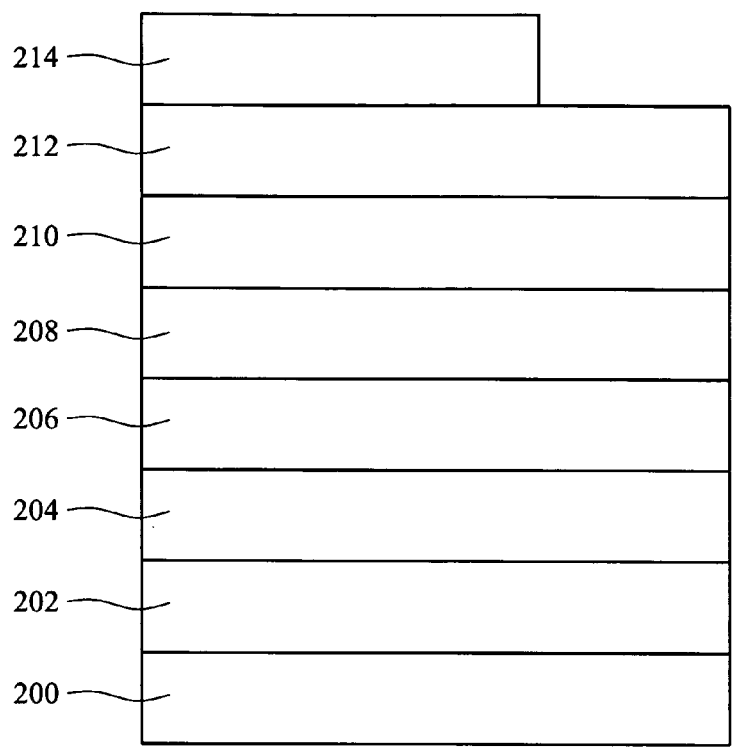
Figure 2D:
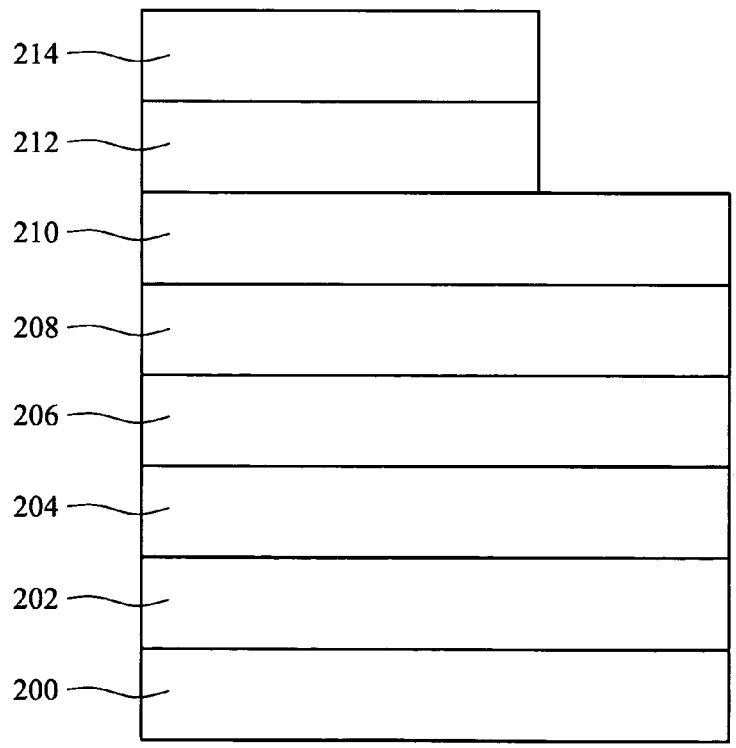
Figure 2E:
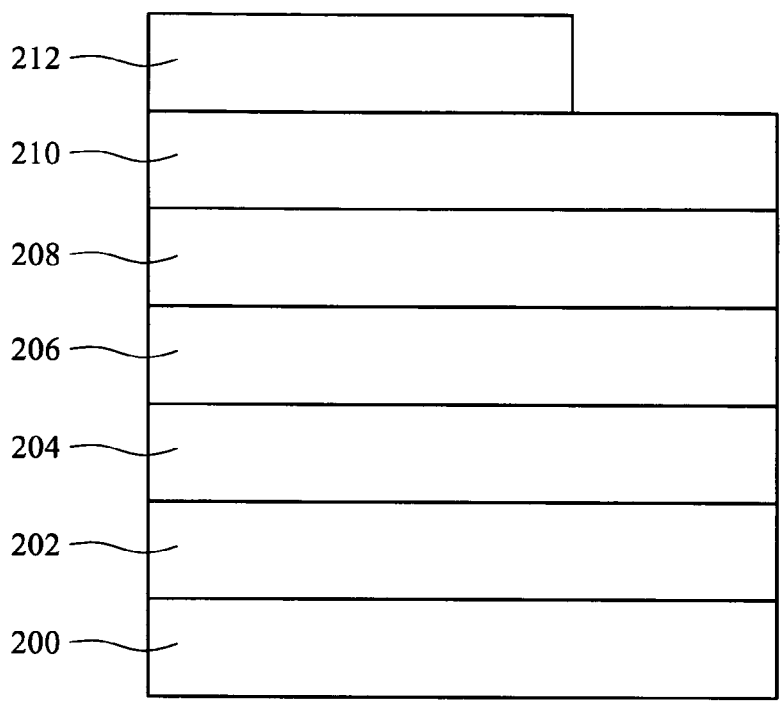

Then, the photoresist layer 214 is defined by using a first mask (not shown) and a photolithography method, to remove a portion of the photoresist layer 214 until exposing the underlying etching mask layer 212, so as to transfer the pattern of the first mask into the photoresist layer 214, such as shown in FIG. 2c. After the definition of the photoresist layer 214, the exposed etching mask layer 212 is etched and removed by using the photoresist layer 214 as the mask, using $SF_6$ as the etching gas and a dry etching method or a wet etching method, preferably a dry etching method, for example, until the underlying transparent conductive oxide layer 210 is exposed, so as to transfer the pattern of the photoresist layer 214 into the etching mask layer 212, such as shown in FIG. 2d. After the etching of the etching mask layer 212 is completed, the remaining photoresist layer 214 is removed by using, for example, a dry stripping method and oxygen plasma, so as to form a structure such as shown in FIG. 2e.

Figure 2F:
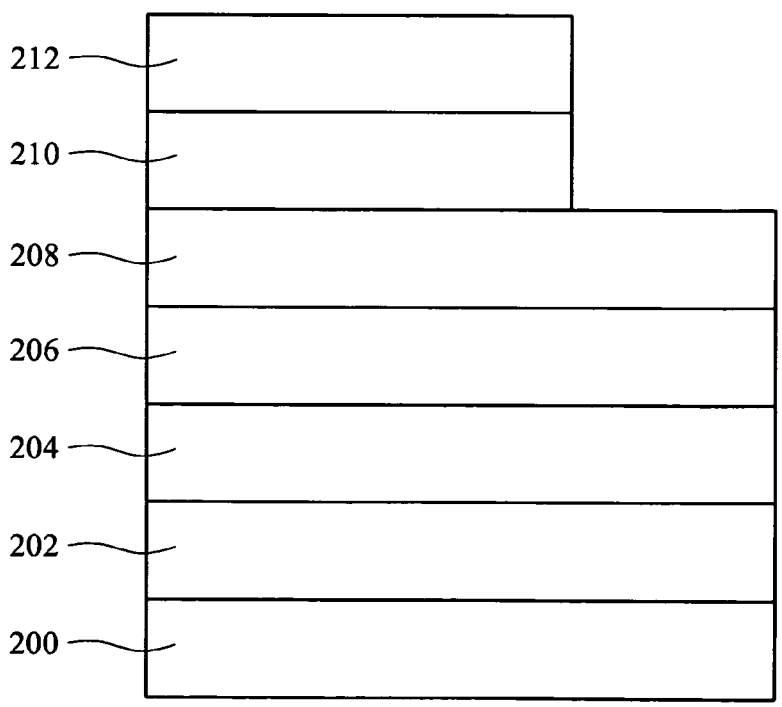
Figure 2G:
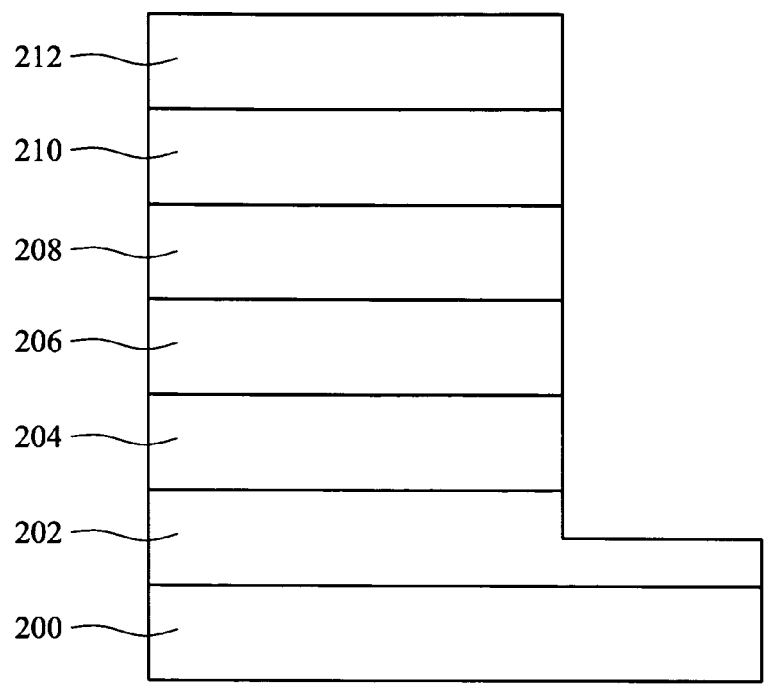

After the pattern transferring of the etching mask layer 212 is completed, the transparent conductive oxide layer 210 is defined by using the patterned etching mask layer 212 and a dry etching method, for example, to etch and remove the exposed transparent conductive oxide layer 210 until the underlying superlattice contact layer 208 is exposed, so as to transfer the pattern of the etching mask layer 212 into the transparent conductive oxide layer 210, such as shown in FIG. 2f. In the etching step of the transparent conductive oxide layer 210, a mixed gas containing halogen gas and argon gas can be used as the etching gas, in which the halogen gas is, for example, chlorine gas or hydrogen chloride. Subsequently, the exposed superlattice contact layer 208 as well as the underlying second conductivity type cladding layer 206 and the active layer 204 are etched and removed by using the etching mask layer and a self-aligned method, until the first conductivity type cladding layer 202 is exposed. In the etching step, a dry etching process is preferably used, and a mixed gas containing chlorine gas and argon gas is used as the etching gas. During the etching step, for the concern of the process reliability, a portion of the exposed first conductivity type cladding layer 202 is also removed, such as shown in FIG. 2g.

Another feature of the present invention is that because the material of the etching mask layer 212 is a dielectric material, the etching mask layer 212 can be used as the mask for etching the transparent conductive oxide layer 210. Accordingly, the etching mask layer 212 can be used as the mask for etching the transparent conductive oxide layer 210 and the underlying epitaxial layers, which is unlike the conventional process that has to define the epitaxial layers firstly and form the transparent conductive layer separately, and which thereby greatly simplifies the process and effectively shortens the process time. In addition, after the etching of the transparent conductive oxide layer 210, because the etching mask layer 212 can also be used as the mask layer for etching the epitaxial layers, the epitaxial layers underlying the transparent conductive oxide layer 210 can be etched by a self-aligned method, and the process can be further simplified to increase the throughput and lower the cost. Moreover, the transparent conductive oxide layer 210 and the underlying epitaxial layers are defined by a self-aligned method, so that the transparent conductive oxide layer 210 can cover the entire top surface of the superlattice contact layer 208, thereby increasing the illuminative area of the device to enhance the brightness of the device.

Figure 2H:
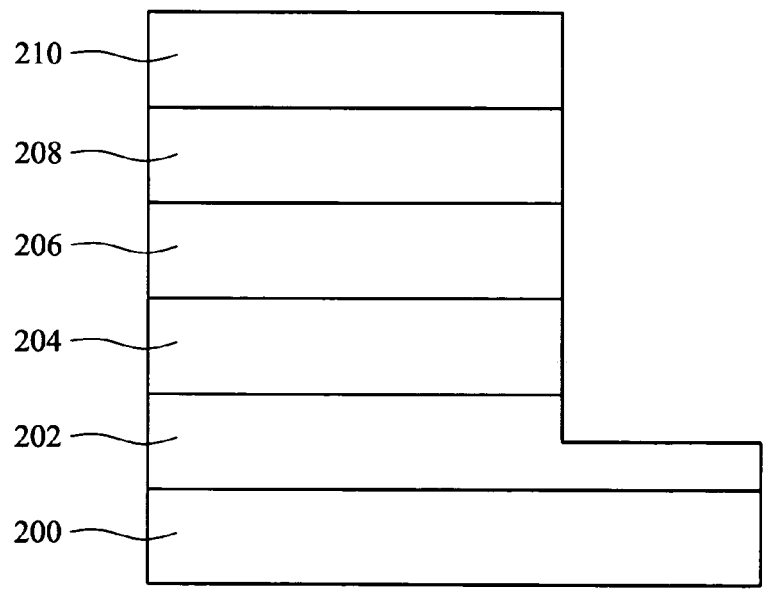
Figure 2I:
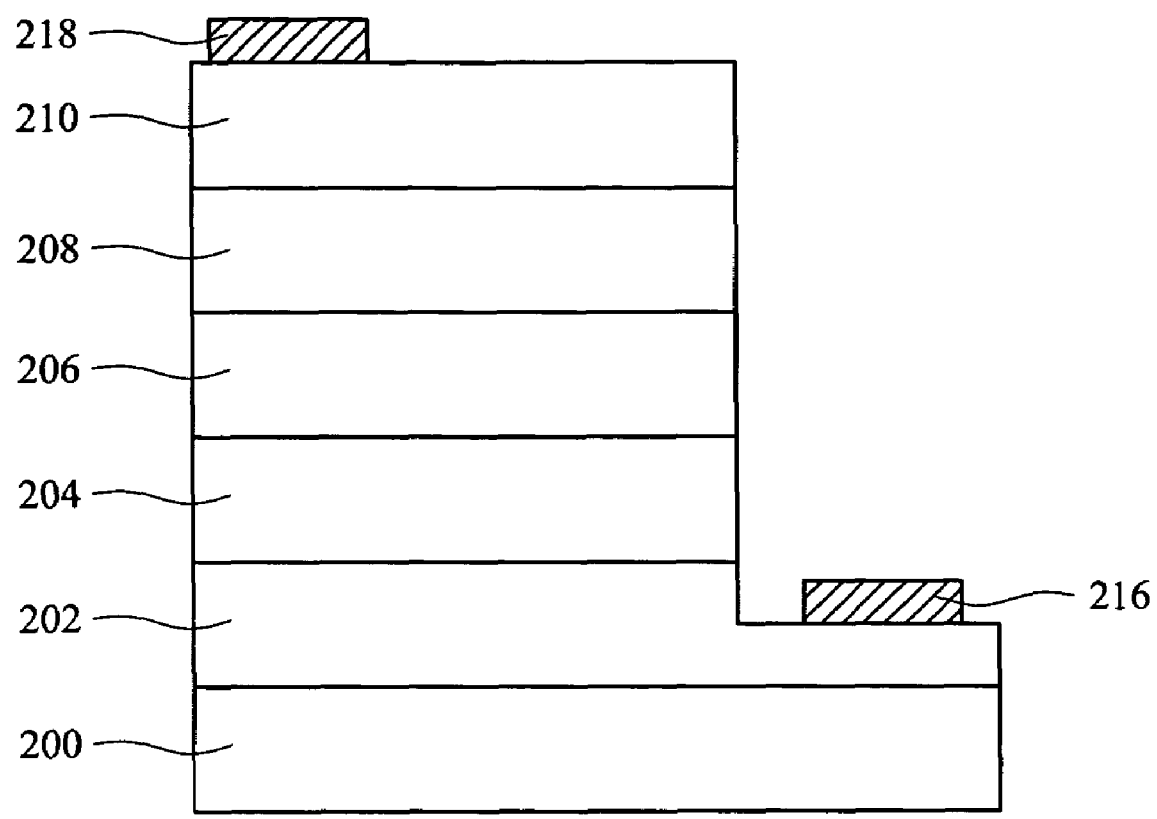

Next, the remaining etching mask layer 212 is removed by using, for example, a dry etching method and $SF_6$ as the etching gas, so as to form a structure such as shown in FIG. 2h. After the etching mask layer 212 is removed, a first conductivity type electrode 216 and a second conductivity type electrode 218 are respectively formed on a portion of the exposed first conductivity type cladding layer 202 and a portion of the transparent conductive oxide layer 210 by using a second mask (not shown) and an e-beam deposition method, for example, so as to complete the fabrication of the light-emitting diode device, such as shown in FIG. 2i. The first conductivity type electrode 216 and the second conductivity type electrode 218 are composed of Cr/Au structures or Cr/Pt/Au structures.

There are only two masks employed to manufacture a light-emitting diode structure in the present invention, but there are five masks needed in the conventional process for manufacturing a light-emitting diode structure. Obviously, with the application of the present invention, the amount of the masks can be greatly decreased, and the amount of the process steps can be reduced. The simplification of the process can increase the throughput and enhance the yield.

According to the aforementioned description, one advantage of the present invention is that an insulating etching mask layer is formed on a transparent conductive oxide layer, so that the contamination resulting from the use of a metal mask can be avoided to effectively prevent the short circuit condition caused by the metal mask from occurring.

According to the aforementioned description, another advantage of the present invention is that a transparent conductive oxide layer and the underlying epitaxial layers are etched by using the same etching mask layer and a self-aligned method, so that the amount of the masks is decreased to decrease the amount of the process steps, and the transparent conductive oxide layer can cover the entire top surface of the underlying superlattice contact layer to increase the illuminative area of the device and achieve the purpose of enhancing the brightness of the device.

According to the aforementioned description, a further advantage of the present invention is that only two masks are employed in the present method, so that the process cost can be lowered, and the amount of the process steps can be decreased to reduce the process time and achieve the purpose of enhancing the throughput and the yield.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for manufacturing a light-emitting diode (LED), comprising:

providing a substrate, wherein the substrate includes a first conductivity type cladding layer, an active layer, a second conductivity type cladding layer, a superlattice contact layer and a transparent conductive oxide layer stacked thereon in sequence;

forming an etching mask layer on a portion of the transparent conductive oxide layer, wherein the etching mask layer is an insulator;

performing a first etching step to remove the exposed portion of the transparent conductive oxide layer until the superlattice contact layer is exposed;

performing a second etching step to remove the exposed portion of the superlattice contact layer as well as the second conductivity type cladding layer and the active layer underlying the exposed portion of the superlattice contact layer until the first conductivity type cladding layer is exposed;

removing the etching mask layer; and forming a first conductivity type electrode and a second conductivity type electrode respectively on the exposed portion of the first conductivity type cladding layer and the transparent conductive oxide layer.

2. The method for manufacturing a light-emitting diode according to claim 1, wherein a material of the transparent conductive oxide layer is selected from the group consisting of indium tin oxide (ITO), indium zinc oxide (IZO) and aluminum-doped zinc oxide (ZnO:Al, AZO).

3. The method for manufacturing a light-emitting diode according to claim 1, wherein a material of the etching mask layer is an dielectric material.

4. The method for manufacturing a light-emitting diode according to claim 1, wherein a material of the etching mask layer is selected from the group consisting of silicon dioxide, silicon nitride and silicon oxy-nitride.

5. The method for manufacturing a light-emitting diode according to claim 1, wherein the step of forming the etching mask layer comprises:

forming a dielectric layer to cover the transparent conductive oxide layer;

forming a photoresist layer to cover the dielectric layer;

performing a photolithography step on the photoresist layer by using a mask to remove a portion of the photoresist layer and expose a portion of the dielectric layer;

removing the exposed portion of the dielectric layer until another portion of the transparent conductive oxide layer is exposed, so as to complete the etching mask layer; and removing the remaining photoresist layer.

6. The method for manufacturing a light-emitting diode according to claim 5, wherein the step of removing the dielectric layer is performed by a dry etching method.

7. The method for manufacturing a light-emitting diode according to claim 6, wherein the step of removing the dielectric layer is performed by using an etching gas, and the etching gas comprises SF6.

8. The method for manufacturing a light-emitting diode according to claim 5, wherein the step of removing the remaining photoresist layer is performed by using oxygen plasma.

9. The method for manufacturing a light-emitting diode according to claim 1, wherein the first etching step is performed by using a dry etching method and an etching gas, the etching gas is a mixed gas containing a halogen-based gas and an argon gas, and the halogen-based gas is selected from the group consisting of chlorine gas and hydrogen chloride.

10. The method for manufacturing a light-emitting diode according to claim 1, wherein the second etching step is performed by using a dry etching method and a mixed gas containing chlorine gas and argon gas.

11. The method for manufacturing a light-emitting diode according to claim 1, wherein the step of forming the first conductivity type electrode and the second conductivity type electrode is performed by using a mask and an e-beam deposition method.

12. The method for manufacturing a light-emitting diode according to claim 1, wherein a structure of the first conductivity type electrode and a structure of the second conductivity type electrode are selected from the group consisting of a Cr/Au structure and a Cr/Pt/Au structure.

13. A method for manufacturing a light-emitting diode, comprising:

providing a substrate, wherein the substrate includes a first conductivity type cladding layer, an active layer, a second conductivity type cladding layer, a superlattice contact layer and a transparent conductive oxide layer stacked thereon in sequence;

forming a dielectric layer to cover the transparent conductive oxide layer;

forming a photoresist layer to cover a portion of the dielectric layer by using a first mask;

removing an exposed portion of the dielectric layer by using the photoresist layer until a portion of the transparent conductive oxide layer is exposed;

removing the remaining photoresist layer;

performing a definition step by using the dielectric layer to remove an exposed portion of the transparent conductive oxide layer, as well as the superlattice contact layer, the second conductivity type cladding layer and the active layer underlying the exposed portion of the transparent conductive oxide layer until the first conductivity type cladding layer is exposed;

removing the dielectric layer; and forming a first conductivity type electrode and a second conductivity type electrode respectively on the exposed portion of the first conductivity type cladding layer and the transparent conductive oxide layer by using a second mask.

14. The method for manufacturing a light-emitting diode according to claim 13, wherein a material of the transparent conductive oxide layer is selected from the group consisting of indium tin oxide, indium zinc oxide and aluminum-doped zinc oxide.

15. The method for manufacturing a light-emitting diode according to claim 13, wherein a material of the etching mask layer is selected from the group consisting of silicon dioxide, silicon nitride and silicon oxy-nitride.

16. The method for manufacturing a light-emitting diode according to claim 13, wherein the step of forming the photoresist layer comprises:

forming a photoresist material film to cover the dielectric layer; and performing a photolithography step on the photoresist material film by using the first mask to remove a portion of the photoresist material film and expose a portion of the dielectric layer.

17. The method for manufacturing a light-emitting diode according to claim 13, wherein the step of removing the exposed portion of the dielectric layer is performed by using a dry etching method and an etching gas, and the etching gas comprises SF6.

18. The method for manufacturing a light-emitting diode according to claim 13, wherein the definition step comprises:

performing a first etching step on the transparent conductive oxide layer by using the dielectric layer, to remove the exposed portion of the transparent conductive oxide layer until the superlattice contact layer is exposed; and performing a second etching step by using the dielectric layer, to remove an exposed portion of the superlattice contact layer as well as the second conductivity type cladding layer and the active layer underlying the exposed portion of the superlattice contact layer until the first conductivity type cladding layer is exposed.

19. The method for manufacturing a light-emitting diode according to claim 18, wherein the first etching step is performed by using a dry etching method and an etching gas, the etching gas is a mixed gas containing a halogen-based gas and an argon gas, and the halogen-based gas is selected from the group consisting of chlorine gas and hydrogen chloride.

20. The method for manufacturing a light-emitting diode according to claim 18, wherein the second etching step is performed by using a dry etching method and a mixed gas containing chlorine gas and argon gas.

21. The method for manufacturing a light-emitting diode according to claim 13, wherein the step of forming the first conductivity type electrode and the second conductivity type electrode is performed by an e-beam deposition method.

22. The method for manufacturing a light-emitting diode according to claim 13, wherein a structure of the first conductivity type electrode and a structure of the second conductivity type electrode are selected from the group consisting of a Cr/Au structure and a Cr/Pt/Au structure.

* * * * *